United States Patent
Seok et al.

(10) Patent No.: US 12,527,028 B2
(45) Date of Patent: Jan. 13, 2026

(54) NEGATIVE CHARGE EXTRACTION STRUCTURE FOR EDGE TERMINATION

(71) Applicant: SEMICONDUCTOR COMPONENTS INDUSTRIES, LLC, Scottsdale, AZ (US)

(72) Inventors: Kyoung Wook Seok, Santa Clara, CA (US); Clifford Drowley, Santa Clara, CA (US); Andrew J. Walker, Santa Clara, CA (US); Andrew P. Edwards, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 372 days.

(21) Appl. No.: 18/137,329

(22) Filed: Apr. 20, 2023

(65) Prior Publication Data

US 2024/0120417 A1  Apr. 11, 2024

Related U.S. Application Data

(60) Provisional application No. 63/336,132, filed on Apr. 28, 2022.

(51) Int. Cl.
| | |
|---|---|
| *H10D 30/62* | (2025.01) |
| *H10D 30/01* | (2025.01) |
| *H10D 30/66* | (2025.01) |
| *H10D 62/10* | (2025.01) |
| *H10D 62/85* | (2025.01) |
| *H10D 64/62* | (2025.01) |

(52) U.S. Cl.
CPC ......... *H10D 30/665* (2025.01); *H10D 30/024* (2025.01); *H10D 30/62* (2025.01); *H10D 30/6219* (2025.01); *H10D 62/102* (2025.01); *H10D 62/85* (2025.01); *H10D 62/8503* (2025.01); *H10D 64/62* (2025.01)

(58) Field of Classification Search
CPC .. H10D 30/024; H10D 30/62; H10D 30/6219; H10D 30/665; H10D 62/85; H10D 62/102; H10D 62/8503; H10D 64/62; H10D 30/477; H10D 62/105; H10D 62/112; H10D 30/63
USPC .......................................................... 257/329
See application file for complete search history.

(56) References Cited

U.S. PATENT DOCUMENTS

| | | | |
|---|---|---|---|
| 9,117,839 B2 | 8/2015 | Kizilyalli et al. | |
| 11,637,209 B2 * | 4/2023 | Drowley | H10D 84/811 |
| | | | 257/76 |

* cited by examiner

*Primary Examiner* — Monica D Harrison
(74) *Attorney, Agent, or Firm* — Kevin B. Jackson

(57) ABSTRACT

A gallium nitride (GaN) power device includes a GaN substrate structure having a first surface and a second surface, a metallic layer coupled to the second surface of the GaN substrate structure, and an active region including an array of vertical fin-based field effect transistors (FinFETs) coupled to the GaN substrate structure. The GaN power device also includes an edge termination structure circumscribing the active region and a seal ring structure circumscribing the edge termination structure and comprising a seal ring metal pad operable to conduct charge from the edge termination structure to the metallic layer.

16 Claims, 7 Drawing Sheets

NEGATIVE CHARGE EXTRACTION STRUCTURE FOR EDGE TERMINATION

CROSS-REFERENCES TO RELATED APPLICATIONS

This application claims priority to U.S. Provisional Patent Application No. 63/336,132, filed Apr. 28, 2022, and entitled "Negative Charge Extraction Structure for Edge Termination," the entire contents of which are hereby incorporated by reference in their entirety.

BACKGROUND OF THE INVENTION

Vertical power transistors, in which the current flows from the top surface of the transistor to the back or bottom surface of the transistor substrate, are commonly used for controlling high currents and high voltages, since they can be formed with a reduced area compared to devices in which current flow through the transistor is lateral (e.g. a typical GaN high electron mobility transistor (HEMT)).

III-nitride materials, and in particular, gallium nitride (GaN) substrates, allow vertical field effect transistor (FET)-based power transistors to be fabricated with high breakdown voltages (e.g., in excess of 1200 V) while offering significant reductions in the specific on-resistance (i.e., the on-resistance of the device multiplied by the device area) compared to silicon or silicon carbide materials.

Despite the progress made in the field of vertical power transistors, there is a need in the art for improved methods and systems related to vertical power transistors.

SUMMARY OF THE INVENTION

The present invention generally relates to the field of electronics, and more specifically to semiconductor manufacturing technology. In a particular embodiment, multiple embodiments of power devices are provided. The power devices have various designs to extract negative charge accumulated at the periphery of the edge termination structure by providing a current path to extract the accumulated negative charge. The techniques disclosed herein are generally applicable to compound vertical power devices.

According to an embodiment of the present invention, a gallium nitride (GaN) power device is provided. The GaN power device includes a GaN substrate structure having a first surface and a second surface and a metallic layer coupled to the second surface of the GaN substrate structure. The GaN power device also includes an active region including an array of vertical fin-based field effect transistors (FinFETs) coupled to the GaN substrate structure, an edge termination structure circumscribing the active region, and a seal ring structure circumscribing the edge termination structure and comprising a seal ring metal pad operable to conduct charge from the edge termination structure to the metallic layer.

The GaN substrate structure can include a passivation layer and an interlayer dielectric (ILD) layer and the charge is present at an interface of the passivation layer and the ILD layer. The seal ring metal pad can be electrically connected to a source metal pad through a via formed in the ILD layer. The GaN substrate structure can include an n-type GaN substrate having a growth surface, a first n-type GaN epitaxial layer coupled to the growth surface of the n-type GaN substrate, and a second n-type GaN epitaxial layer coupled to the first n-type GaN epitaxial layer. The ILD layer is coupled to the second n-type GaN epitaxial layer and the passivation layer is coupled to the ILD layer. The GaN power device can further include a guard ring disposed in the second n-type GaN epitaxial layer and surrounding a portion of the second n-type GaN epitaxial layer and an insulating region formed in the second n-type GaN epitaxial layer and surrounding the guard ring. The source metal pad can make ohmic contact with the second n-type GaN epitaxial layer. The edge termination structure can include a plurality of guard rings. The plurality of guard rings can include a plurality of floating guard rings.

According to another embodiment of the present invention, a gallium nitride (GaN) power device is provided. The GaN power device includes an array of vertical fin-based field effect transistors (FinFETs) disposed in an active region, an edge termination structure circumscribing the active region, and an edge seal structure disposed laterally between the edge termination structure and a scribe line. The edge seal structure includes a portion of a p-type GaN layer, wherein the p-type GaN layer is electrically connected to the scribe line, an interlayer dielectric (ILD) layer coupled to the p-type GaN layer, a metal pad passing through portions of the ILD layer, and a gate metal contact electrically connected to the p-type GaN layer.

The GaN power device can further include an n-type GaN substrate having a first surface and a second surface, wherein the array of FinFETs is coupled to the n-type GaN substrate, a metallic layer coupled to the second surface of the n-type GaN substrate, an n-type GaN epitaxial layer coupled to the first surface of the n-type GaN substrate, wherein the p-type GaN layer is coupled to the n-type GaN epitaxial layer, and a passivation layer coupled to the ILD layer. The edge seal structure can be operable to conduct charge from the edge termination structure to the metallic layer. The charge can be present at an interface of the passivation layer and the ILD layer.

According to a specific embodiment of the present invention, a gallium nitride (GaN) power device is provided. The GaN power device includes an array of vertical fin-based field effect transistors (FinFETs) disposed in an active region, an edge termination structure circumscribing the active region, and an edge seal structure disposed laterally between the edge termination structure and a scribe line. The edge seal structure includes an insulation layer electrically connected to the scribe line, an interlayer dielectric (ILD) layer coupled to the insulation layer, and a metal pad passing through portions of the ILD layer and electrically connected to the insulation layer.

The GaN power device can further include an n-type GaN substrate having a first surface and a second surface, wherein the array of FinFETs is coupled to the n-type GaN substrate, a metallic layer coupled to the second surface of the n-type GaN substrate, an n-type GaN epitaxial layer coupled to the first surface of the n-type GaN substrate, wherein the insulation layer is coupled to the n-type GaN epitaxial layer, and a passivation layer coupled to the ILD layer. The edge seal structure can be operable to conduct charge from the edge termination structure to the metallic layer. The charge can be present at an interface of the passivation layer and the ILD layer.

Numerous benefits are achieved by way of the present disclosure over conventional techniques. For example, embodiments of the present invention provide power devices that can achieve a reduced leakage current and avoid lowering the breakdown voltage. Therefore, the performance and stability of the vertical power devices are improved. These and other embodiments of the invention, along with many of its advantages and features, are described in more detail in conjunction with the text below and corresponding figures.

DETAILED DESCRIPTION OF SPECIFIC EMBODIMENTS

Power transistors that can withstand high voltages (>600 V) are becoming popular in applications such as industrial and commercial power supplies, solar inverters, and electric vehicle (EV) power trains. A key performance specification for such a transistor is to exhibit low leakage. High leakage causes higher power dissipation in the off-state and during switching. High leakage can also cause inefficient power conversion and device failure. As described herein, embodiments of the present invention reduce leakage in these high-power transistors.

Edge termination structures of vertical gallium nitride (GaN) power devices are about 5 times narrower than vertical silicon (Si) power devices for similar target breakdown voltage, due to a much larger band gap and about 10 times higher critical electric field than those of vertical silicon power devices. Therefore, the average lateral electric field is about 5 times higher than that of vertical silicon power devices. As a result, the insulation layer over the edge termination structure is characterized by higher stress and higher leakage current.

Figure 1A:
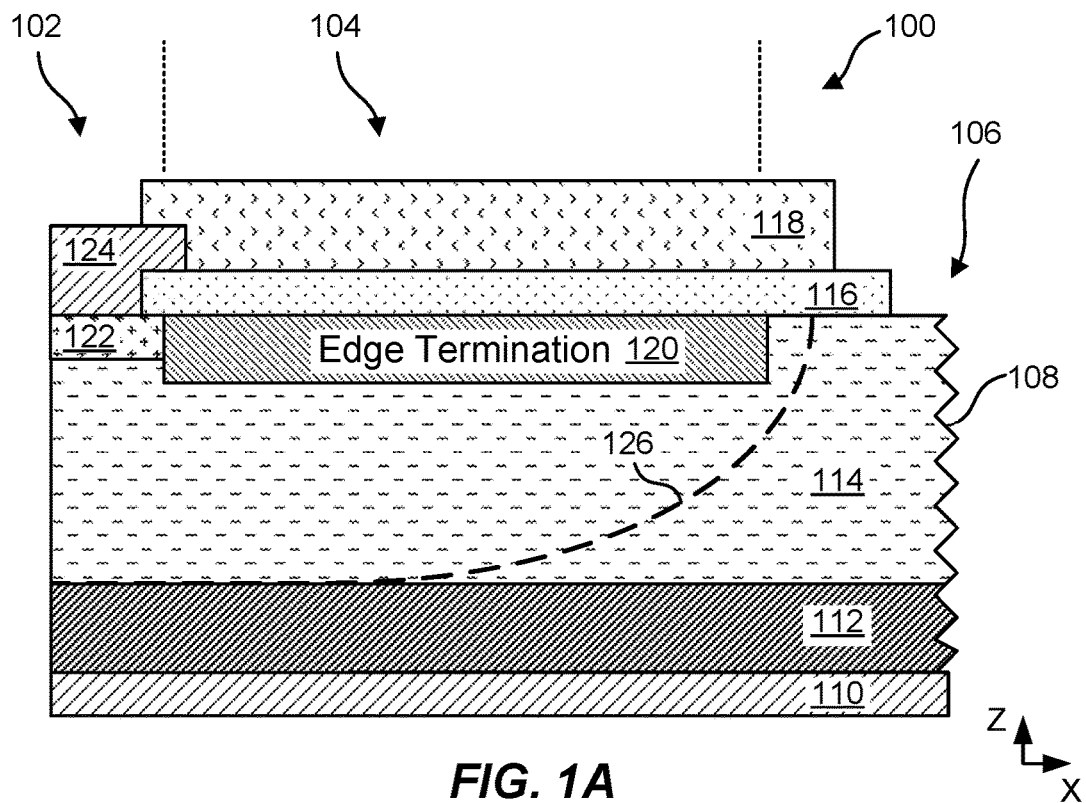
FIG. 1A is a cross-sectional view schematic diagram illustrating an edge of a vertical GaN power device according to an embodiment of the present invention.
Figure 2A:
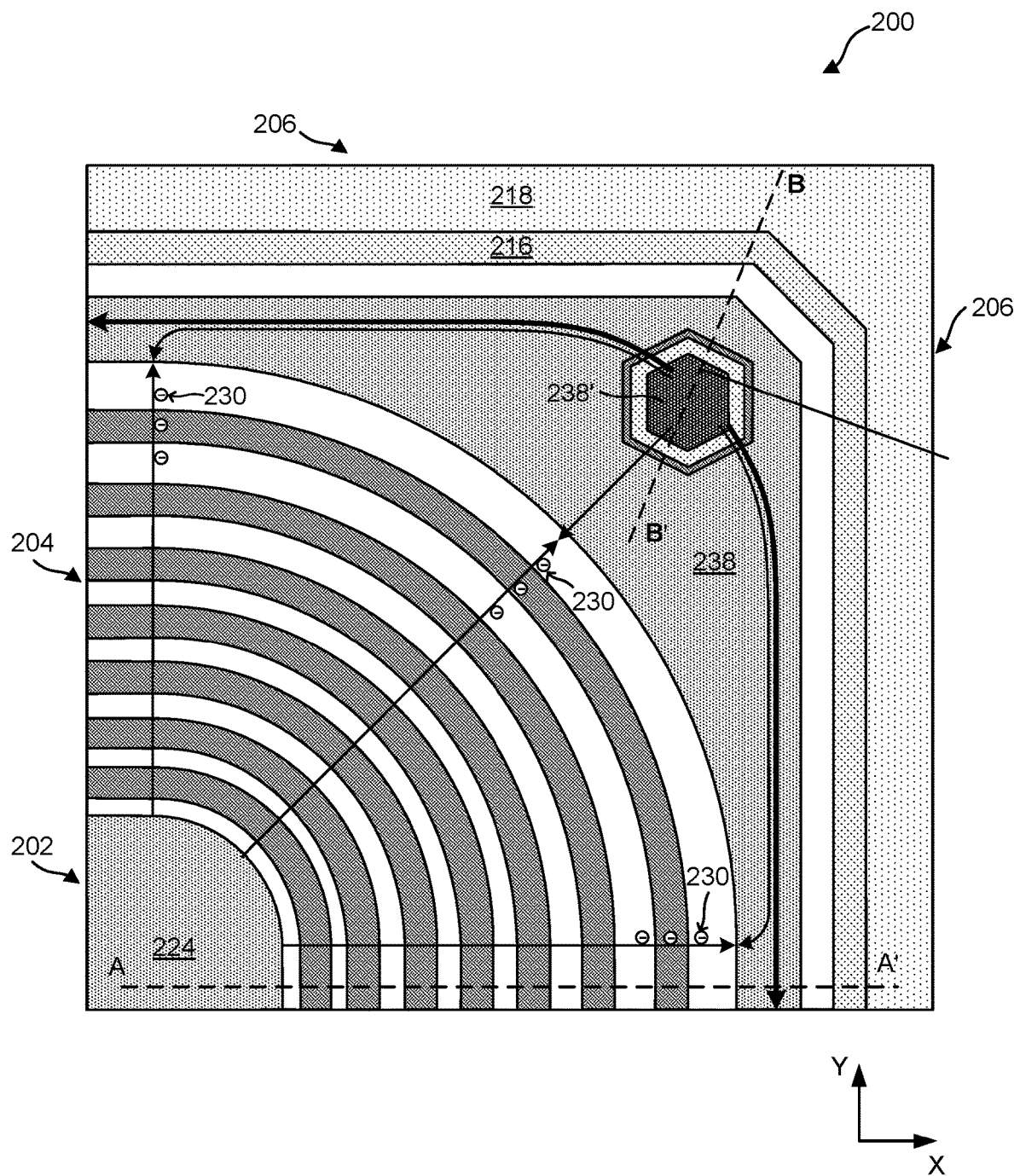
FIG. 2A is a plan view schematic diagram illustrating a layout of a negative charge extraction structure according to an embodiment of the present invention.
Figure 6:
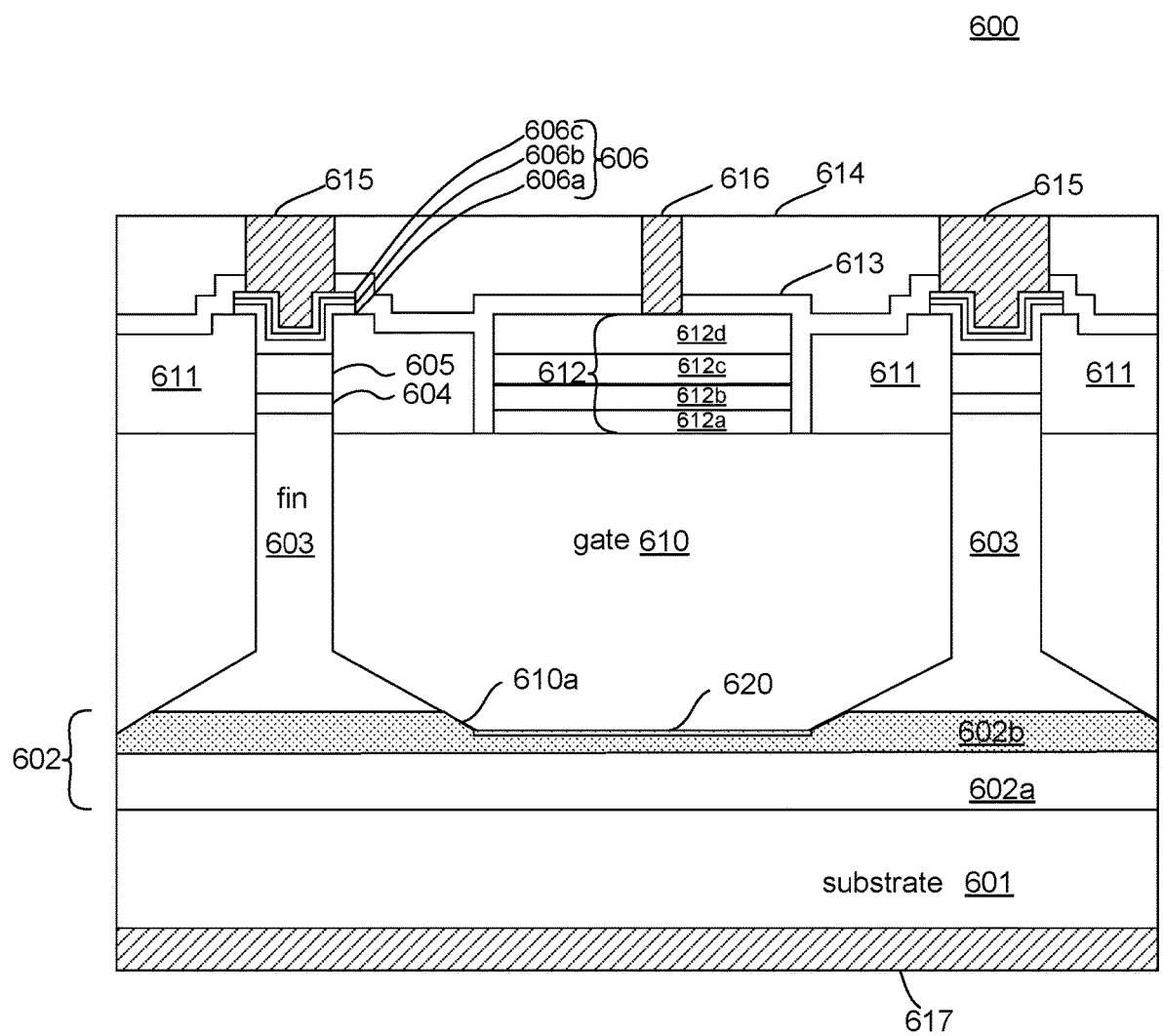
FIG. 6 is a cross-sectional view of a vertical fin-based field effect transistor device according to an embodiment of the present disclosure.
Figure 7:
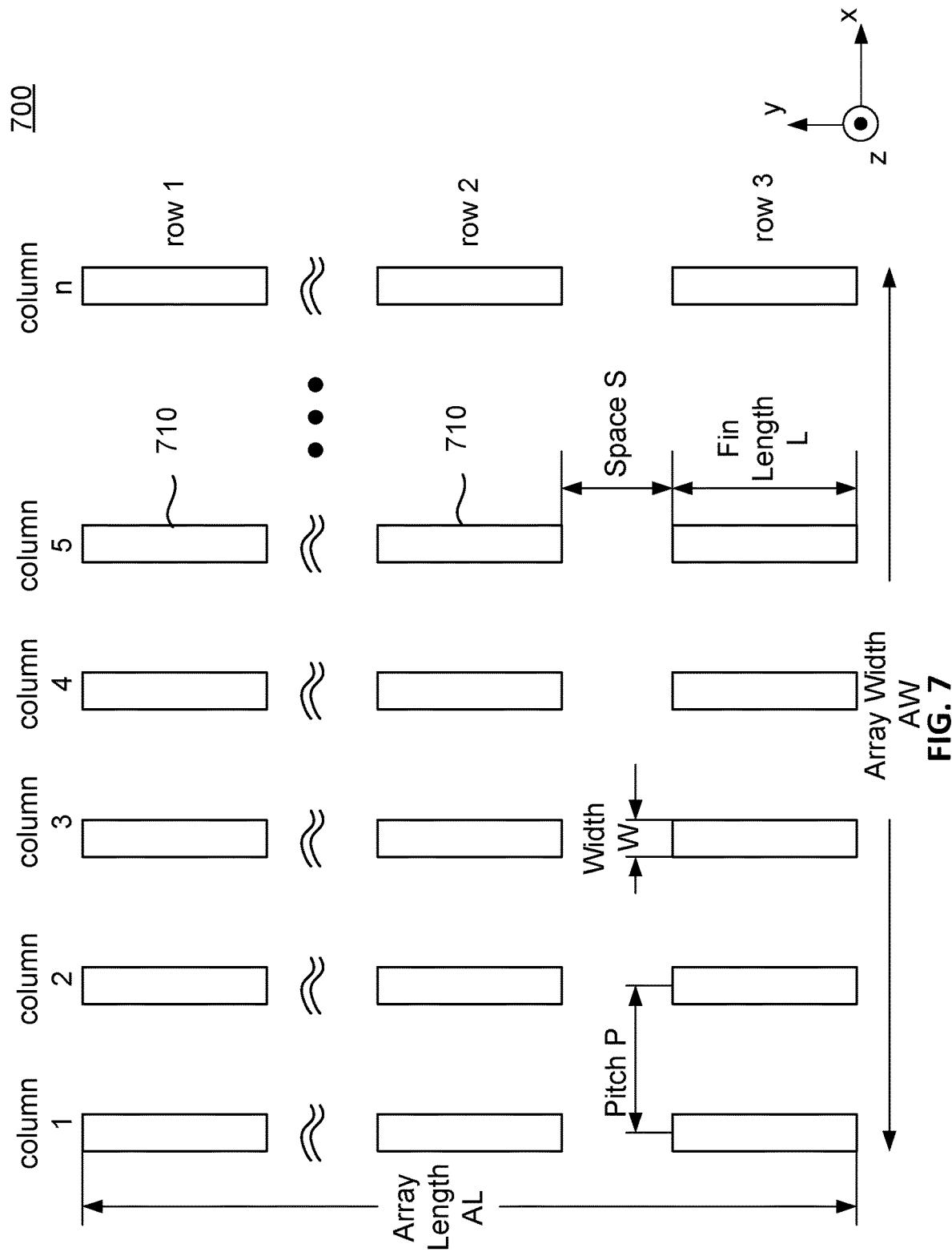
FIG. 7 is a plan view of a fin pattern layout illustrating a fin array 700 having a plurality of semiconductor fins having predetermined lengths according to an embodiment of the present disclosure.

FIG. 1A is a cross-sectional view schematic diagram illustrating an edge of a vertical GaN power device according to an embodiment of the present invention. In the example shown in FIG. 1A, the vertical GaN power device 100 includes an active region 102 and an edge termination region 104. The active region can include an array of vertical, fin-based field effect transistors (FinFETs) as illustrated in FIGS. 6 and 7. As illustrated in FIG. 2A below, the edge termination region 104 circumscribes the active region 102. Only a portion of the active region 102 is shown in FIG. 1A. The edge termination region 104 is located between the active region 102 and the chip edge 106 of the vertical GaN power device 100 in a horizontal direction (i.e., the X-direction shown in FIG. 1A). An edge termination structure 120 is located at the edge termination region 104. In the example shown in FIG. 1A, the chip edge 106 includes a scribe line 108, and the chip is sawed using, for example, mechanical sawing.

In the vertical direction (i.e., the Z-direction shown in FIG. 1A), the vertical GaN power device 100 includes, among other elements, a metallic layer 110 serving as the drain, an n-type GaN substrate 112, and an n-type GaN epitaxial layer 114 serving as the drift region. In addition, an interlayer dielectric (ILD) layer 116 is coupled to the n-type GaN epitaxial layer 114, and a passivation layer 118 is coupled to the ILD layer 116. In the active region 102, a p-type GaN layer 122, which serves as the gate, is coupled to the n-type GaN epitaxial layer 114, and a gate metal pad 124 is coupled to the p-type GaN layer 122. Because of the edge termination structure 120, the electric field is reduced gradually toward the chip edge 106. The depletion region edge 126 is denoted by a dashed line in FIG. 1A.

Figure 1B:
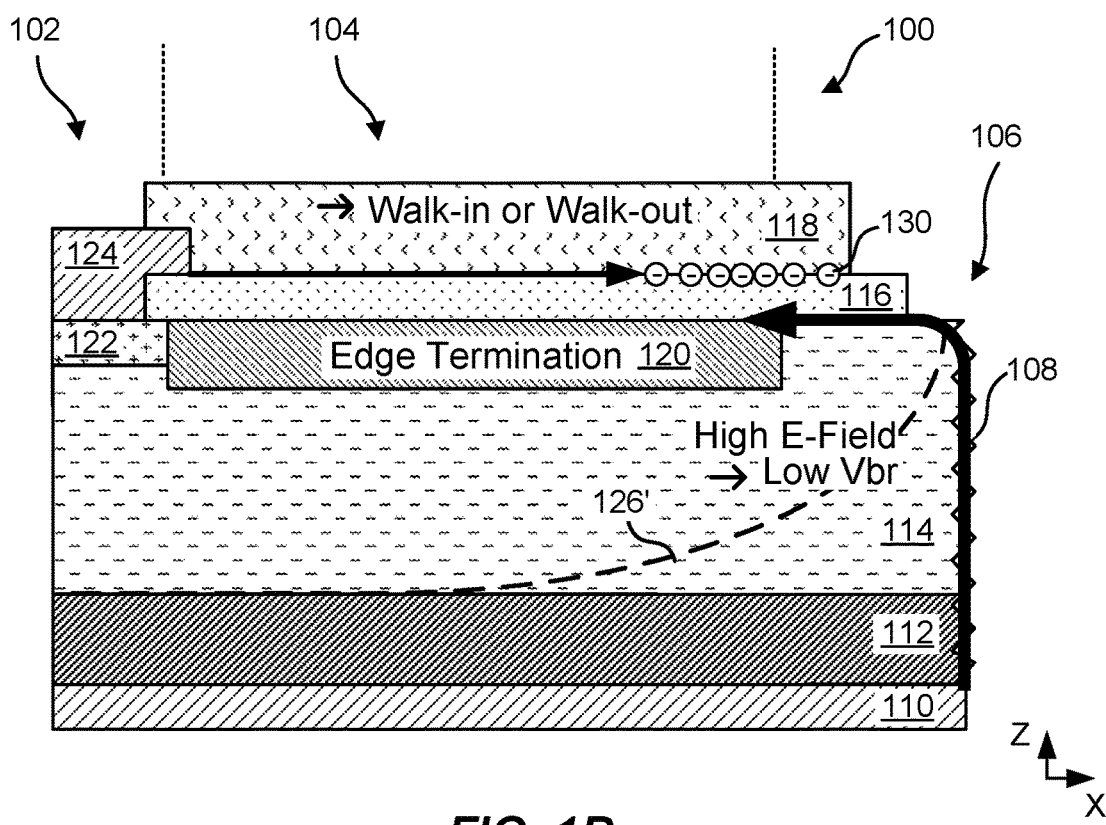
FIG. 1B is a cross-sectional view schematic diagram illustrating the edge of a vertical GaN power device with accumulating electrons according to an embodiment of the present invention.

FIG. 1B is a cross-sectional view schematic diagram illustrating the edge of a vertical GaN power device with accumulating electrons according to an embodiment of the present invention. Some electric charge may accumulate at, for example, the interface between the ILD layer 116 and the passivation layer 118. In one embodiment, the charge comes from electrons 130 that accumulate at, for example, the interface between the ILD layer 116 and the passivation layer 118. The electrons 130 flow through the interface between the ILD layer 116 and the passivation layer 118, starting from the gate metal pad 124 toward the scribe line 108, due to the presence of the electric field. However, there is no path for the electrons 130 to be removed via the elements of the vertical GaN power device 100. As a result, the electrons 130 accumulate near the scribe line side of the edge termination structure 120, i.e., at the periphery of the edge termination structure 120. The accumulated electrons 130 will cause the depletion region to increase in extent such that it extends toward the chip edge 106. The modified depletion region edge 126' is denoted as a dashed line in FIG. 1B.

The negative charge corresponding to the electrons 130 modulates the electric field and depletion region, making the electric field higher. A higher electric field can lower the breakdown voltage. In some severe cases, the modified depletion region edge 126' may approach the scribe line 108, which is characterized by a high number of defects in implementations in which mechanical sawing is used to form the chip edge. The defects, serving as a source of leakage current, contribute to the leakage current of the GaN power device. Consequently, the leakage current flowing from the metallic layer 110 to the edge termination structure 120 (shown by the arrow in FIG. 1B) increases. Even for acceptable levels of leakage current, static charge over the edge termination structure 120 lowers the breakdown voltage and may even induce unstable breakdown voltage behavior like walk-in or walk-out. When the breakdown voltage is lower than that of the active region, the vertical GaN power device 100 is unstable. Additionally, the presence of a high electric field near the scribe line 108 can induce movement of ions and poor reliability.

To address the issues described above, different structures and methods for forming negative charge extraction structures for edge termination are provided. A current path is created in each of these embodiments, the negative charge is extracted, and the electrons flow to the drain at the backside of the vertical power device.

FIG. 2A is a plan view schematic diagram illustrating a layout of a negative charge extraction structure according to an embodiment of the present invention. FIG. 2A shows a corner of the chip in which a floating guard ring edge termination structure is utilized. Although a floating guard ring edge termination structure is illustrated in FIG. 2A, this is not required by the present invention and other edge termination structures are included within the scope of the present invention. One of ordinary skill in the art would recognize many variations, modifications, and alternatives.

Figure 2B:
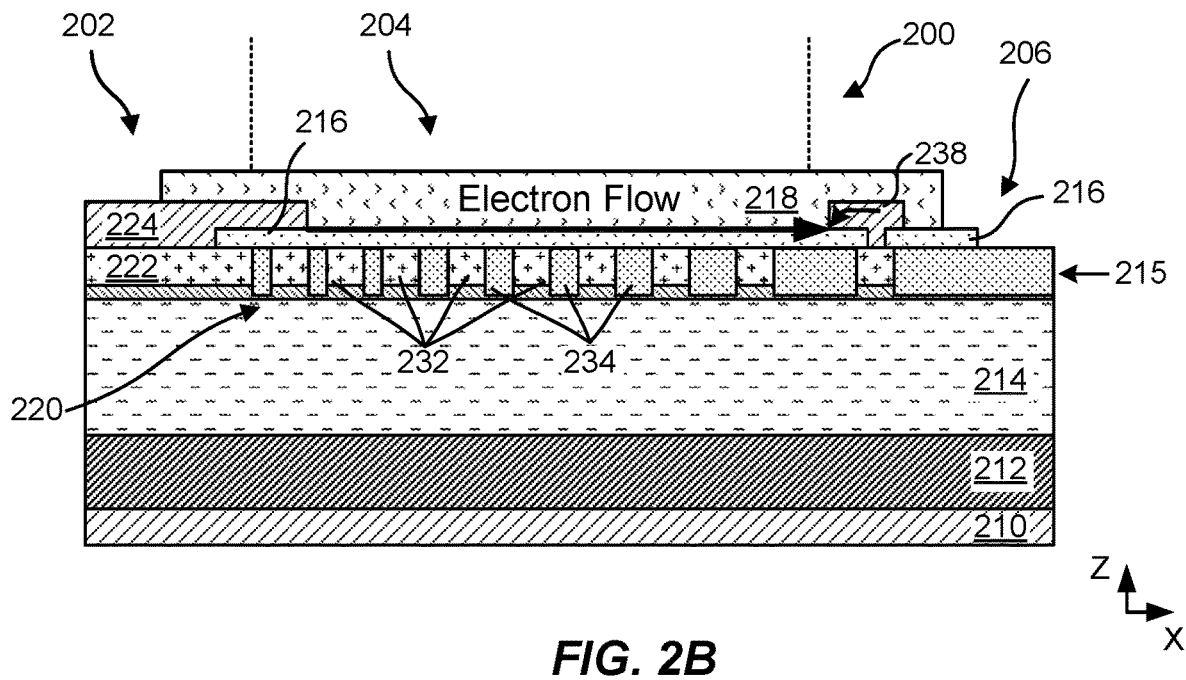
FIG. 2B is a cross-sectional view schematic diagram illustrating a cross-section of the negative charge extraction structure taken through cross-section A-A' in FIG. 2A.
Figure 2C:
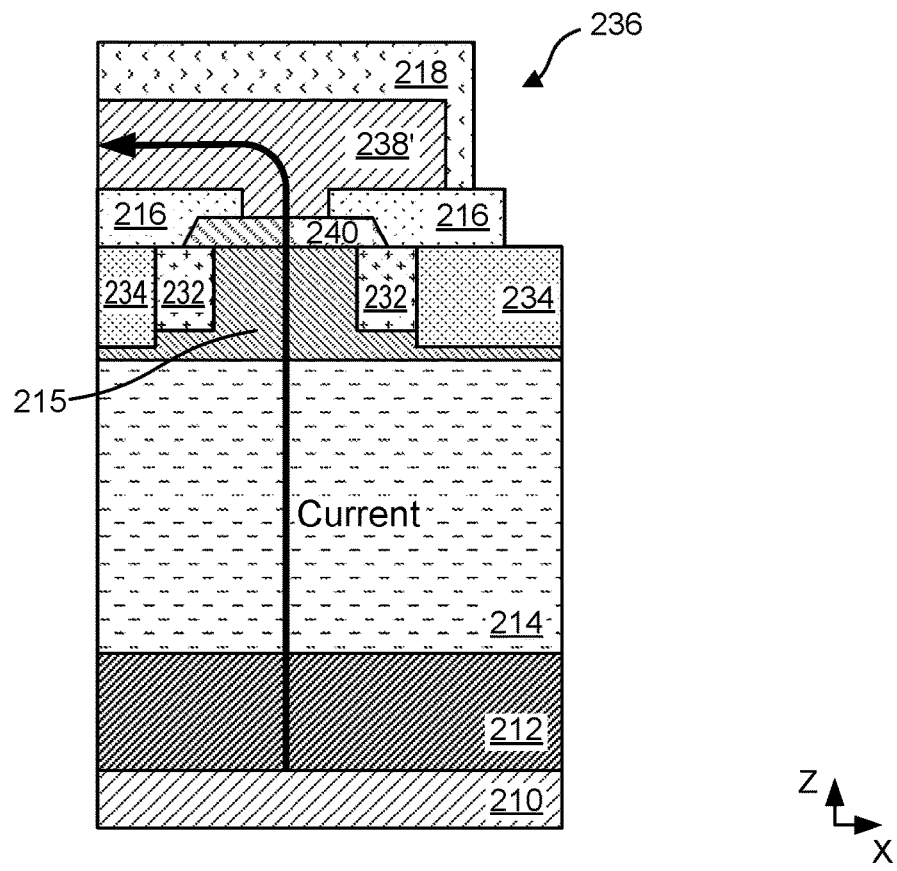
FIG. 2C is an enlarged cross-sectional view schematic diagram illustrating a cross-section of the negative charge extraction structure taken through B-B' in FIG. 2A.

FIG. 2B is a cross-sectional view schematic diagram illustrating a cross-section of the negative charge extraction structure taken through cross-section A-A' in FIG. 2A. FIG. 2C is an enlarged cross-sectional view schematic diagram illustrating a cross-section of the negative charge extraction structure taken through B-B' in FIG. 2A.

In the example shown in FIGS. 2A-2C, the vertical GaN power device 200 includes, among other elements, a metallic layer 210 serving as the drain, an n-type GaN substrate 212, and an n-type GaN epitaxial layer 214 serving as the drift region. The n-type GaN substrate thus serves as a growth surface for the n-type GaN epitaxial layer 214. The n-type GaN epitaxial layer 214 can be referred to as a first n0-type GaN epitaxial layer. Another n-type GaN epitaxial layer 215, which may be referred to as a second n-type GaN epitaxial layer, is originally formed on the n-type GaN epitaxial layer 214 and in some embodiments is utilized for the channel of the FinFET in the active region 202. In the active region 202, a p-type GaN layer 222 is later formed in a trench formed in the n-type GaN epitaxial layer 215 and serves as the gate of vertical fin-based field effect transistors (FinFETs). A gate metal pad 224 is coupled to the p-type GaN layer 222.

As an example, a vertical FET transistor structure is described in U.S. Pat. No. 9,117,839 (Kizilyalli, et al.) (the "'839 structure"), the disclosure of which is hereby incorporated by reference in its entirety for all purposes. In the '839 structure, the transistor conducting channel is formed using a semiconductor "fin" created by patterning and etching surrounding material to a certain depth. A semiconductor material with an opposite doping type is epitaxially regrown (e.g., using metalorganic vapor phase epitaxy (MOVPE)) to be substantially planar to the top of the semiconductor "fin". The regrown material serves as the gate electrode of a vertical FET, and application of control voltages to the gate electrode modulates the conduction of current in the vertical "fin" channel between the top of the fin ("source") and bottom of the fin (normally, the drift region which is further connected to the "drain" electrode via the semiconductor substrate). In one example, an array of fins are arranged in the active region. Although some embodiments are described in relation to FinFET devices, embodiments of the present invention are not limited to this particular device structure and other electronic devices, including vertical FETs with implanted junctions, vertical metal oxide semiconductor FETs (MOSFETs), and the like can utilize the charge extraction systems described herein.

In the edge termination region 204, the edge termination structure 220 illustrated in FIG. 2B includes multiple (float-ing) guard rings 232 circumscribing the active region 202. The guard rings, which, in some embodiments, can be formed as regrown p-type material, are separated by insulating regions 234 between two neighboring guard rings 232. Both guard rings 232 and the insulating regions 234 are formed in the trenches formed in the n-type GaN epitaxial layer 215. It should be understood that other types of edge termination structures, such as edge termination structures with graded doping densities, may be employed as well. In one implementation, the insulating regions 234 are formed using a neutralizing ion implantation. In some embodiments, the guard rings are formed by implanting p-type dopants into the n-type layers 214 and 215, and subsequently annealing and activating the implanted dopants to form p-type guard rings. The seal ring structure 236 in the chip edge 206 will be described below, with reference to FIG. 2C.

In addition, an interlayer dielectric (ILD) layer 216 is formed on the top surface of the edge termination structure 220, and a passivation layer 218 is coupled to the ILD layer 216.

At the chip edge 206, a seal ring structure 236 is formed. As shown in FIG. 2B, the seal ring structure 236 includes a seal ring metal pad 238 formed in the passivation layer 218. The seal ring metal pad 238 is electrically connected to a metal pad 240, which is formed in the ILD layer 216, through a via formed in the ILD layer 216. Metal pad 240 can also be referred to as a source metal pad since this metal layer is utilized in the active region 202 for the source metal pad connected to the sources of the FinFETs. As illustrated in FIG. 2C, metal pad 240 (i.e., the source metal pad) makes ohmic contact with the n-type GaN epitaxial layer 215, which can also be referred to as the second n-type GaN epitaxial layer. As such, the seal ring metal pad 238 is electrically connected to the n-type GaN epitaxial layer 215, thus forming a current path (denoted as the arrow shown in FIG. 2C) from the metallic layer 210, which serves as the drain, to the seal ring metal pad 238. The seal ring metal pad 238 functions to prevent undesired moisture or contamination outside the chip from penetrating and entering the active region 202 and the edge termination region 204.

Referring back to FIG. 2A, electrons 230 can accumulate, for example at the interface between dissimilar dielectric materials utilized in the device. As an example, electrons can accumulate at the interface between the ILD layer 216, which can be fabricated using silicon nitride, silicon dioxide, a combination thereof, and the like, and the passivation layer, which can be fabricated using silicon nitride, silicon oxide, phosphorus- or boron-doped silicon oxide, combinations thereof, and the like. The electrons 230 flow through the edge termination region 204 outwardly towards the chip edge 206, as explained above. Due to the existence of the seal ring metal pad 238, the electrons 230 can further flow to the seal ring metal pad 238, as the seal ring metal pad 238 is in contact with the interface between the ILD layer 216 and the passivation layer 218, as shown in FIG. 2B. Because the seal ring metal pad 238 circumscribes the edge termination region 204, the electrons 230 from different directions can flow to a portion of the seal ring metal pad 238 illustrated as seal ring metal plug 238' in FIGS. 2A and 2C. The seal ring metal plug 238' is at the top right corner of the chip and has a hexagonal shape in the example shown in FIG. 2A. It should be understood that this is not intended to be limiting, and various shapes, locations, or dimensions of the seal ring metal plug 238' may be employed as needed. For instance, there may be four seal ring metal plugs located at four corners of the chip.

Referring to FIG. 2C, the seal ring metal plug 238', and the seal ring metal pad 238 illustrated in FIGS. 2A and 2B, are electrically connected to the n-type GaN epitaxial layer 215, thus forming a current path from the metallic layer 210, which serves as the drain, to the seal ring metal pad 238. Consequently, the seal ring metal pad 238 is operable to conduct charge (e.g., the electrons 230 in this example shown in FIG. 2A) from the edge termination region 204 to the metallic layer 210. In other words, the seal ring structure 236 provides a vehicle to extract the negative charge that is present in the edge termination region 204 (e.g., at the interface between the ILD layer 216 and the passivation layer 218, in the example shown in FIG. 2B). As illustrated in FIGS. 2B and 2C, electrons accumulating, for example, at the interface between ILD layer 216 and the passivation layer 218, flow toward the edge of the device and into the seal ring metal pad 238. At the corners of the device, the seal ring metal plug 238' is electrically connected to the seal ring metal pad 238, enabling the accumulated electrons to flow through the n-type material to the metallic layer 210 (i.e., the drain). Accordingly, the problems associated with the accumulated negative charge described above are addressed. The leakage current is reduced, and breakdown at lower voltages is avoided, thus improving the performance of the vertical GaN power device 200.

As shown in FIG. 2C, the seal ring metal plug 238' and the metal pad 240 are horizontally located at a location where no guard ring 232 or insulating region 234 blocks the vertical current path such that the n-type GaN epitaxial layer 215 is "accessible" to the metal pad 240 and the seal ring metal plug 238'. In the example shown in FIG. 2C, two neighboring guard rings 232 sandwich a portion of the n-type GaN epitaxial layer 215, and the two neighboring guard rings 232 are located between two insulating regions 234 in the X-direction.

Figure 3:
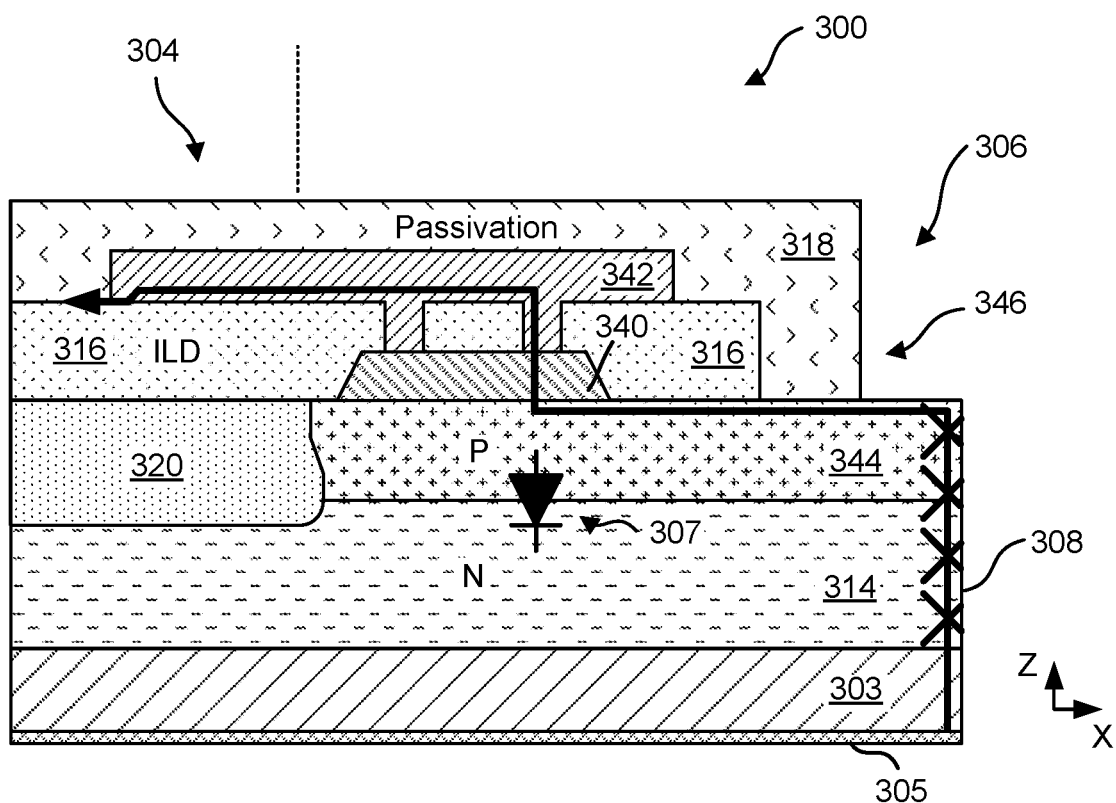
FIG. 3 is a cross-sectional view schematic diagram illustrating a negative charge extraction structure according to another embodiment of the present invention.

FIG. 3 is a cross-sectional view schematic diagram illustrating a negative charge extraction structure according to another embodiment of the present invention. In the example shown in FIG. 3, the vertical GaN power device 300 includes, among other elements, a metallic layer 305 serving as the drain, an n-type GaN substrate 303, and an n-type GaN epitaxial layer 314 serving as the drift region. The edge of the chip is illustrated in FIG. 3 and the active region 202, which is surrounded by edge termination structure 320, is not shown for purposes of clarity.

In the edge termination region 304, the edge termination structure 320 is formed using, for example, isolation ion implantation, which lowers the electrical conductivity of the edge termination structure 320 as compared to the p-type GaN epitaxial layer 344. In one implementation, a p-type GaN epitaxial layer is formed on the n-type GaN epitaxial layer 314, and the portion of the p-type GaN epitaxial layer that corresponds to the edge termination structure 320 is neutralized, for example, ion implanted, to lower the electrical conductivity. The edge termination structure 320 circumscribes the active region. It should be understood that other types of edge termination structures, such as multiple guard rings and edge termination structures with graded doping densities, may be employed as well.

In addition, an interlayer dielectric (ILD) layer 316 is formed on the top surface of the edge termination structure 320 and the p-type GaN epitaxial layer 344, and a passivation layer 318 is coupled to the ILD layer 316.

At the chip edge 306, an edge seal structure 346 is formed. As shown in FIG. 3, the edge seal structure 346 includes, among other things, the p-type GaN epitaxial layer 344, a metal pad 342 formed in the passivation layer 318, and a gate metal contact 340 formed in the ILD layer 316. Referring to FIGS. 2B and 3, metal pad 342 is comparable to seal ring metal pad 238. The p-type GaN epitaxial layer 344 is located laterally between the edge termination structure 320 and the scribe line 308. The p-type GaN epitaxial layer 344, which is utilized as the gate layer in active region 202, is electrically connected to the scribe line 308. The metal pad 342 is electrically connected to the gate metal contact 340, through at least one via passing through a portion of the ILD layer 316. As such, the metal pad 342 is electrically connected to the p-type GaN epitaxial layer 344, thus forming a current path (denoted as the arrow shown in FIG. 3). In some examples, the metal pad 342 circumscribes the active region and the edge termination region 304.

Unlike the embodiment shown in FIGS. 2A-2C, the n-type GaN epitaxial layer 314 is not accessible from the top due to the presence of p-type GaN epitaxial layer 344. The p-n junction (denoted by diode 307 in FIG. 3) formed at the interface between the n-type GaN epitaxial layer 314 and the p-type GaN epitaxial layer 344 has a built-in potential that prevents the electrons accumulated at the periphery of the edge termination region 304 from flowing toward the metallic layer 305 at the backside of the vertical GaN power device 300.

However, an alternative current path is formed in the embodiment shown in FIG. 3. As explained above, the p-type GaN epitaxial layer 344 is electrically connected to the scribe line 308, and there are mechanical defects located at a defect region at the scribe line 308. These mechanical defects can enable conduction in the GaN surface. As a result, the electrons can flow horizontally, through the p-type GaN epitaxial layer 344 and reach the scribe line, before flowing downward in the negative Z-direction to the metallic layer 305, which serves as the drain. Therefore, although the n-type GaN epitaxial layer 314 is not accessible from the top, an alternative current path (denoted by the arrow shown in FIG. 3) is formed to extract the accumulated electrons. Accordingly, the problems associated with the accumulated negative charge described above are addressed. The leakage current is reduced, and the lowered breakdown voltage is avoided, thus improving the performance of the vertical GaN power device 300.

Figure 4:
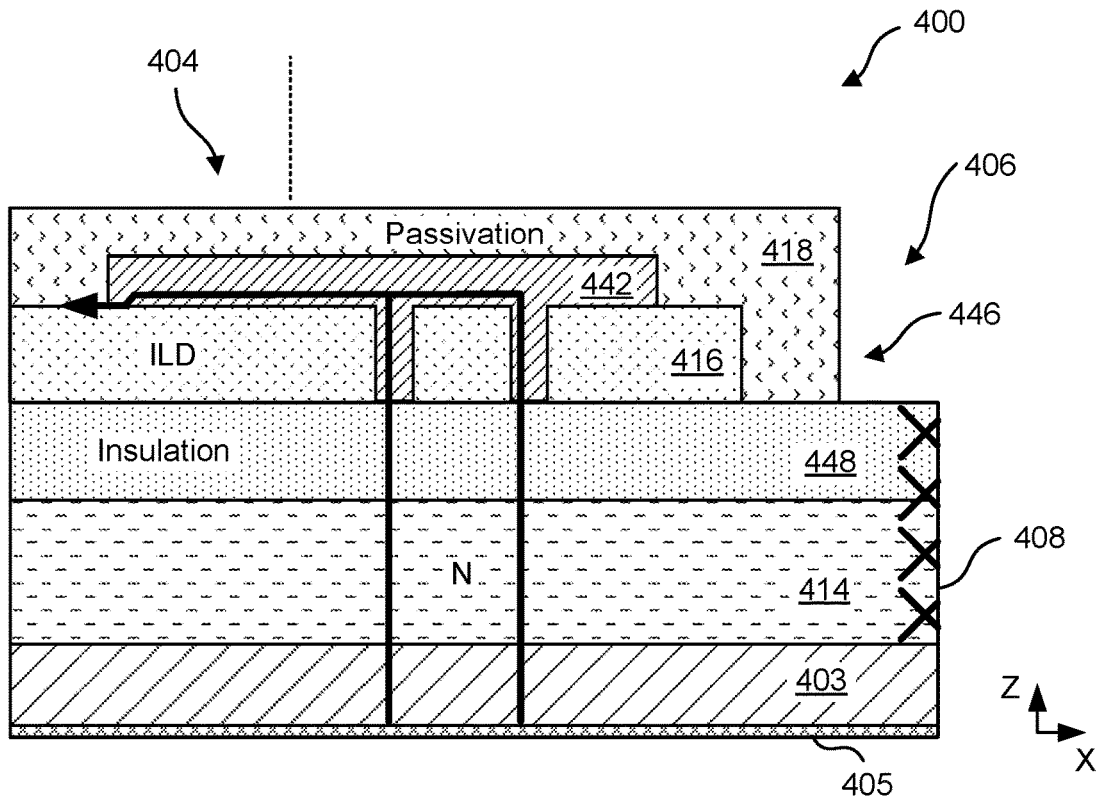
FIG. 4 is a cross-sectional view schematic diagram illustrating a negative charge extraction structure according to yet another embodiment of the present invention.
Figure 5:
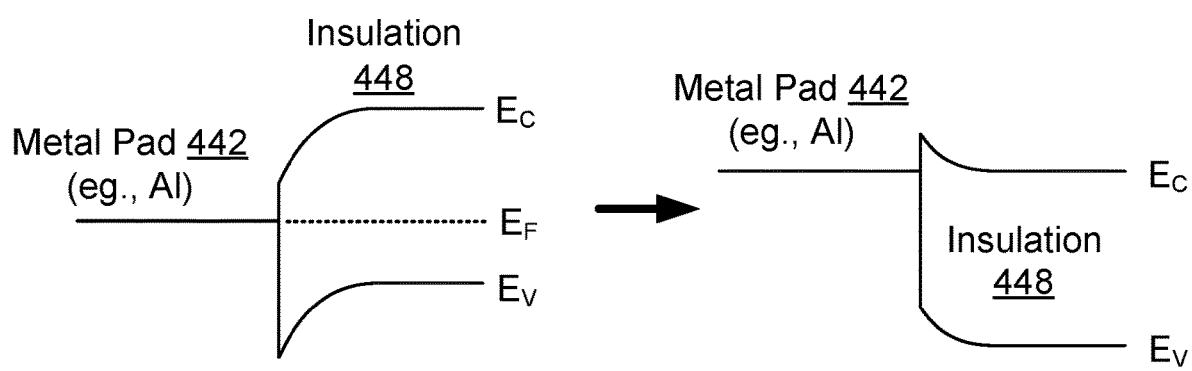
FIG. 5 is a band diagram illustrating the band bending at the metal-insulator interface of the negative charge extraction structure shown in FIG. 4.

FIG. 4 is a cross-sectional view schematic diagram illustrating a negative charge extraction structure according to yet another embodiment of the present invention. FIG. 5 is a band diagram illustrating the band bending at the metal-insulator interface of the negative charge extraction structure shown in FIG. 4.

In the example shown in FIG. 4, the vertical GaN power device 400 includes, among other elements, a metallic layer 405 serving as the drain, an n-type GaN substrate 403, and an n-type GaN epitaxial layer 314 serving as the drift region. The active region 202 illustrated in FIG. 2A is not shown.

In contrast to the embodiment shown in FIG. 3, an insulation layer 448 is coupled to the n-type GaN epitaxial layer 414. The insulation layer 448 is electrically connected to the scribe line 408. From another perspective, the portion of the insulation layer 448 that is located at the edge termination region 404 still serves as the edge termination structure, but the insulation layer 448 also extends laterally toward the scribe line 408, instead of the p-type GaN epitaxial layer 344 shown in FIG. 3. In one embodiment, the insulation layer 448 is electrically connected to the scribe line 408. In one implementation, the insulation layer 448 includes a remaining n-type GaN epitaxial layer at the bottom, which is coupled to the n-type GaN epitaxial layer 414, and a p-type GaN layer on the remaining n-type GaN epitaxial layer. The p-type GaN layer is implanted, and its electrical conductivity is lowered such that it is converted into an insulator.

At the chip edge 406, an edge seal structure 446 is formed. As shown in FIG. 4, the edge seal structure 446 includes, among other elements, the insulation layer 448, and a metal pad 442 formed in the passivation layer 418. The metal pad 442 is electrically connected to the insulation layer 448, through at least one via passing through the ILD layer 416. In some examples, the metal pad 442 circumscribes the active region and the edge termination region 404.

Referring to FIGS. 4 and 5, when the metal pad 442 and the via are in contact with the insulation layer 448, the energy band of the insulation layer 448 bends such that the Fermi level ($E_F$) of the two materials are equal at thermal equilibrium. As a result, a large barrier height is formed, and electrons cannot reach the conduction band at ordinary temperatures. In contrast, when the electrons accumulate at the periphery of the edge termination region 404 and flow to the metal side of the interface between the via and the insulation layer 448, holes in the insulation layer 448 are attracted to a region close to the interface. Consequently, a built-in potential is established, which bends the conduction band and valence band of the insulation layer 448 and lowers the barrier height. Thus, the electrons can tunnel through the interface to the insulation layer 448. As such, a current path is formed in the embodiment shown in FIG. 4 and the accumulated electrons can flow to the metallic layer 405, which serves as the drain. Accordingly, the problems associated with the accumulated negative charge described above are addressed. The leakage current is reduced, and breakdown at lower voltages is avoided, thus improving the performance of the vertical GaN power device 400.

FIG. 6 is a cross-sectional view of a vertical fin-based field effect transistor device according to an embodiment of the present disclosure. The terms "FET," "FinFET," and "vertical fin-based FET" are interchangeable used herein. Referring to FIG. 6, FET device 600 may include a semiconductor substrate 601, a drift layer 602 (e.g., an n-type GaN drift layer) including a uniformly doped region 602a on semiconductor substrate 601 and a graded doping region 602b on uniformly doped region 602a, and a plurality of fins 603 protruding from graded doping region 602b. In one embodiment, each of the fins 603 may include a heavily doped layer 604 disposed in an upper portion of the fin and a metal layer 605, e.g., a refractory metal, refractory metal compound or refractory metal alloy layer (e.g., a TiN layer) disposed on heavily doped layer 604. FET device 600 may also include a source contact structure 606 on metal layer 605 (e.g., TiN). Source contact structure 606 may include a titanium (Ti) layer 606a on metal layer 605, an aluminum (Al) layer 606b on titanium (Ti) layer 606a, and a barrier metal layer (e.g., molybdenum (Mo), titanium (Ti), tantalum (Ta), or similar) 606c on aluminum (Al) layer 606b.

FET device 600 may further include a gate region 610 having a bottom portion in direct contact with graded doping region 602b, an insulating layer 611 (e.g., including silicon dioxide or silicon nitride) disposed on gate region 610 and surrounding fins 603, a gate contact structure 612 disposed on gate region 610, a first interlayer dielectric layer 613 disposed on insulating layer 611 and gate contact structure 612, and a second interlayer dielectric layer 614 disposed on first interlayer dielectric layer 613. In one embodiment, gate contact structure 612 may include a nickel (Ni) layer 612a disposed on gate region 610, a first gold (Au) layer 612b disposed on nickel (Ni) layer 612a, a barrier layer 612c, including, for example, a metal layer (e.g., molybdenum (Mo), titanium (Ti), tantalum (Ta), or the like) disposed on first gold (Au) layer 612b, and a second gold (Au) layer 612d disposed on barrier layer 612c.

FET device 600 may also include a first via contact 615 extending through first interlayer dielectric layer 613 and second interlayer dielectric layer 614 and in contact with source contact structure 606, a second via contact 616 extending through first interlayer dielectric layer 613 and second interlayer dielectric layer 614 and in contact with gate contact structure 612, and a drain metal layer 617 forming a drain contact on the bottom surface of semiconductor substrate 601. As used herein, the terms "drift layer" and "drift region" are used interchangeably, the terms "doped layer" and "doped region" are used interchangeably, and the terms "graded doping region" and "graded doping layer" are used interchangeably.

In some embodiments, semiconductor substrate 601 may include an n-type (e.g., N+ dopant) III-nitride material, fins 603 may include an n-type (e.g., N dopant) III-nitride material having a first dopant concentration, and uniformly doped region 602a of drift layer 602 may include an n-type (e.g., N doped) III-nitride material having a second dopant concentration lower than the first dopant concentration, and graded doping region 602b having a third dopant concentration that increases (e.g., linearly) from the second dopant concentration to the first dopant concentration.

In one embodiment, the first dopant concentration is about $7.5 \times 10^{16}$ atoms/cm$^3$, and the second dopant concentration is about $1 \times 10^{16}$ atoms/cm$^3$.

In one embodiment, the drift region has a thickness of about 12 µm, the graded doping region has a thickness of about 0.3 µm, and the semiconductor fin has a height in a range between about 0.7 µm and 0.8 µm and a width of about 0.2 µm.

In one embodiment, gate region 610 may include an $In_xGa_{1-x}N$ layer, where $0<x<1$, i.e., x is between 0 and 1 and is not equal to 0 or 1. In one embodiment, gate region 610 is disposed in a recess region between two adjacent fins and has a portion 610a in contact with graded doping region 602b. The depth (or the thickness) of portion 610a of the gate layer may affect the threshold voltage, the conductance, and the maximum electric field of the FET device. The effect of the depth (or thickness) of portion 610a embedded in the graded doping region will be described in more detail below.

In one embodiment, the FET device 600 may include a semiconductor substrate 601, which may include an n-type (e.g., N+ doped) GaN material layer, a drain metal layer 617 disposed at its bottom surface, a drift layer 602, e.g., an n-type (e.g., N doped) GaN drift layer, having a uniformly doped region 602a disposed on semiconductor substrate 601 and a graded doping region 602b disposed on the uniformly doped region, and an epitaxial GaN layer disposed on the graded doping region and including a recess region for forming a plurality of fins 603. The FET device may also include a p-type GaN gate layer filling the recess region. The graded doping region 602b may function as a landing pad to ensure sufficient contact for gate region 610. In one embodiment, the gate layer may include a ternary compound semiconductor layer (e.g., an $In_xGa_{1-x}N$ layer, where $0<x<1$). In one embodiment, portion 610a of the gate region 610 may have a depth (or thickness) of about 0.1 µm (+/−0.1 um) extending into graded doping region 602b. The fins each may have a width of about 0.2 µm and are spaced from each other by a space of about 2.0 µm, i.e., the recess region or the gate layer filling the recess region between two adjacent fins has a lateral width of about 2.0 µm. The FET device may also include a two-dimensional electron gas (2DEG) layer 620 formed in an interface between gate region 610 and graded doping region 602b. The area surface of gate region 610 is large, so that a current flows laterally along 2DEG layer 620 before flowing vertically toward drain metal layer 617 in the direction of the substrate, thereby improving the conductance (reducing the on-resistance) of the FET device. In other words, the channel FET device has two portions, with a first portion being a lateral channel that controls the current flow through the 2DEG layer, which distributes the current efficiently in the drift region, and a second portion being a vertical channel which carries the current vertically through the drift region toward semiconductor substrate 601 and drain metal layer 617.

In one embodiment, each of the fins may include a metal layer 605 made of TiN and a multilayer source metal structure (e.g., stacked layers of Ti/Al or Ti/TiN/Al) in which Ti is in contact with metal layer 605. The FET device may also include an insulating layer 611, e.g., a silicon dioxide or silicon nitride layer on gate region 610, which may also be referred to as a dielectric layer. Insulating layer 611 includes an opening where a gate contact structure 612 (e.g., a gate electrode) is formed in contact with gate region 610. Gate contact structure 612 can have a multilayer structure of metals, e.g., Pd/Pt/Au, where Pd is in contact with gate region 610, or Ni and Au, in which the Ni is deposited in contact with gate region 610. Other embodiments can include other gate electrode metal structures known to those skilled in the art.

In one embodiment, each of the fins may include an upper portion having sidewalls parallel to each other and substantially perpendicular to the surface of the substrate and a lower portion having sidewalls non-parallel to each other and forming an angle other than 90 degrees with the surface of the substrate. The parallel sidewalls may define a non-polar plane, such as an m-plane.

In one embodiment, the 2DEG layer is induced by a polarization between the gate layer and the drift region in a c-plane, and the current flowing vertically through the drift region is along an m-plane.

FIG. 7 is a plan view of a fin pattern layout illustrating a fin array 700 having a plurality of semiconductor fins having predetermined lengths according to an embodiment of the present disclosure. A fin is illustrated as a bar-shaped fin having a length smaller than 100 µm, e.g., 50 µm, 25 µm. Referring to FIG. 7, fin array 700, which can be included in the active region 102 illustrated in FIG. 1A, includes a plurality of fins 710 arranged in a plurality of rows (row 1, row 2, row 3) and in a plurality of columns (column 1, column, 2, . . . , column n). The fins in each row are separated from each other by a pitch P. Each row is separated from each other by a space S (i.e., the gap between each row). The total length of the array is thus related to the individual fin length L, the number of rows N, and the space S by AL=N*L+ (N−1)*S. In one embodiment, the space S has a size equal to the pitch P. In another embodiment, the space S can have a size greater than a single pitch P (e.g., 1.2×P, 1.5×P, or 2×P). It is understood that the number of rows and the number of columns can be any integer number. In one embodiment, the number of columns in different rows may be different, for example, to enable "rounding" of the array for improved junction-terminated edge designs. In the example shown in FIG. 7, six fins are used in each row, three rows and six columns are shown, but it is understood that the number of fins and the number of rows and columns are arbitrarily chosen for describing the example embodiment and should not be limiting.

In one exemplary embodiment, the fin length L is about 25 µm, the fin width W is about 0.2 µm, the fin thickness or fin height measured along the z-direction is about 0.8 µm, the pitch P is in the range between 1.5 µm and 2.5 µm. In one embodiment, a ratio between a fin width W and a pitch P between two adjacent fins is in the range between about 0.08 and 0.13, preferably in the range between 0.1 and 0.12. In one embodiment, a ratio between a fin length L and the pitch P between two adjacent fins is in the range between 5 and 25, preferably between 10 and 20, and more preferably between 12 and 16. In one embodiment, the fin length L is about 25 µm and the fin width W is in the range between 0.15 µm and 0.7 µm.

While various embodiments of the invention have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied alone or in some combination, to one or more of the other embodiments of the disclosure, whether or not such embodiments are described, and whether or not such features are presented as being a part of a described embodiment. Thus, the breadth and scope of the present disclosure should not be limited by any of the above-described exemplary embodiments.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof, and adjectives such as "conventional," "traditional," "normal," "standard," "known," and terms of similar meaning, should not be construed as limiting the item described to a given time period, or to an item available as of a given time. But instead these terms should be read to encompass conventional, traditional, normal, or standard technologies that may be available, known now, or at any time in the future. Likewise, a group of items linked with the conjunction "and" should not be read as requiring that each and every one of those items be present in the grouping, but rather should be read as "and/or" unless expressly stated otherwise.

Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to," or other like phrases in some instances shall not be read to mean that the narrower case is intended or required in instances where such broadening phrases may be absent.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A gallium nitride (GaN) power device comprising:
   a GaN substrate structure having a first surface and a second surface;
   a metallic layer coupled to the second surface of the GaN substrate structure;
   an active region including an array of vertical fin-based field effect transistors (FinFETs) coupled to the GaN substrate structure;
   an edge termination structure circumscribing the active region; and
   a seal ring structure circumscribing the edge termination structure and comprising a seal ring metal pad operable to conduct charge from the edge termination structure to the metallic layer.

2. The GaN power device of claim 1, wherein the GaN substrate structure includes a passivation layer and an interlayer dielectric (ILD) layer and the charge is present at an interface of the passivation layer and the ILD layer.

3. The GaN power device of claim 2, wherein the seal ring metal pad is electrically connected to a source metal pad through a via formed in the ILD layer.

4. The GaN power device of claim 2, wherein the GaN substrate structure comprises:
   an n-type GaN substrate having a growth surface;
   a first n-type GaN epitaxial layer coupled to the growth surface of the n-type GaN substrate; and
   a second n-type GaN epitaxial layer coupled to the first n-type GaN epitaxial layer;
   wherein the ILD layer is coupled to the second n-type GaN epitaxial layer and the passivation layer is coupled to the ILD layer.

5. The GaN power device of claim 4, further comprising:
   a guard ring disposed in the second n-type GaN epitaxial layer and surrounding a portion of the second n-type GaN epitaxial layer; and
   an insulating region formed in the second n-type GaN epitaxial layer and surrounding the guard ring.

6. The GaN power device of claim 4, wherein the second n-type GaN epitaxial layer makes ohmic contact with a source metal pad.

7. The GaN power device of claim 1, wherein the edge termination structure comprises a plurality of guard rings.

8. The GaN power device of claim 7, wherein the plurality of guard rings comprise a plurality of floating guard rings.

9. A gallium nitride (GaN) power device comprising:
   an array of vertical fin-based field effect transistors (FinFETs) disposed in an active region;
   an edge termination structure circumscribing the active region; and
   an edge seal structure disposed laterally between the edge termination structure and a scribe line, the edge seal structure comprising:
      a portion of a p-type GaN layer, wherein the p-type GaN layer is electrically connected to the scribe line;
      an interlayer dielectric (ILD) layer coupled to the p-type GaN layer;
      a metal pad passing through portions of the ILD layer; and
      a gate metal contact electrically connected to the p-type GaN layer.

10. The GaN power device of claim 9, wherein the GaN power device further comprises:
    an n-type GaN substrate having a first surface and a second surface, wherein the array of FinFETs is coupled to the n-type GaN substrate;
    a metallic layer coupled to the second surface of the n-type GaN substrate;
    an n-type GaN epitaxial layer coupled to the first surface of the n-type GaN substrate, wherein the p-type GaN layer is coupled to the n-type GaN epitaxial layer; and
    a passivation layer coupled to the ILD layer.

11. The GaN power device of claim 10, wherein the edge seal structure is operable to conduct charge from the edge termination structure to the metallic layer.

12. The GaN power device of claim 11, wherein the charge is present at an interface of the passivation layer and the ILD layer.

13. A gallium nitride (GaN) power device comprising:
    an array of vertical fin-based field effect transistors (FinFETs) disposed in an active region;
    an edge termination structure circumscribing the active region; and
    an edge seal structure disposed laterally between the edge termination structure and a scribe line, the edge seal structure comprising:
       an insulation layer electrically connected to the scribe line;
       an interlayer dielectric (ILD) layer coupled to the insulation layer; and
       a metal pad passing through portions of the ILD layer and electrically connected to the insulation layer.

14. The GaN power device of claim 13, wherein the GaN power device further comprises:
    an n-type GaN substrate having a first surface and a second surface, wherein the array of FinFETs is coupled to the n-type GaN substrate;
    a metallic layer coupled to the second surface of the n-type GaN substrate;
    an n-type GaN epitaxial layer coupled to the first surface of the n-type GaN substrate, wherein the insulation layer is coupled to the n-type GaN epitaxial layer; and
    a passivation layer coupled to the ILD layer.

15. The GaN power device of claim 14, wherein the edge seal structure is operable to conduct charge from the edge termination structure to the metallic layer.

16. The GaN power device of claim 15, wherein the charge is present at an interface of the passivation layer and the ILD layer.

* * * * *